United States Patent
Tada et al.

(10) Patent No.: US 10,103,178 B2
(45) Date of Patent: Oct. 16, 2018

(54) DISPLAY DEVICE

(71) Applicant: Japan Display Inc., Minato-ku (JP)

(72) Inventors: Masahiro Tada, Tokyo (JP); Takashi Nakamura, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/049,385

(22) Filed: Feb. 22, 2016

(65) Prior Publication Data
US 2016/0254276 A1 Sep. 1, 2016

(30) Foreign Application Priority Data

Feb. 26, 2015 (JP) ................................. 2015-036433

(51) Int. Cl.
| | |
|---|---|
| H01L 27/14 | (2006.01) |
| H01L 29/04 | (2006.01) |
| H01L 29/15 | (2006.01) |
| H01L 33/00 | (2010.01) |
| G02F 1/1333 | (2006.01) |
| H01L 21/00 | (2006.01) |
| H01L 21/84 | (2006.01) |
| H01L 27/12 | (2006.01) |
| H01L 27/32 | (2006.01) |
| H01L 29/786 | (2006.01) |

(52) U.S. Cl.
CPC ........ *H01L 27/124* (2013.01); *H01L 27/1222* (2013.01); *H01L 27/3272* (2013.01); *H01L 29/78633* (2013.01); *H01L 29/78618* (2013.01)

(58) Field of Classification Search
CPC ............... H01L 27/124; H01L 27/1222; H01L 27/1255; H01L 27/127; H01L 29/78618; H01L 29/78621; H01L 29/78633; H01L 29/78645; H01L 29/66757; H01L 29/6675; H01L 27/3272
USPC ......... 257/72, 52, 98, 435, E29.282; 349/44, 349/110, 111, 38; 438/149, 34
See application file for complete search history.

(56) References Cited

U.S. PATENT DOCUMENTS

| | | | |
|---|---|---|---|
| 6,525,787 B1 | 2/2003 | Sato | |
| 2003/0202149 A1* | 10/2003 | Miyajima | G02F 1/13454 349/149 |
| 2004/0038501 A1* | 2/2004 | Yamada | H01L 27/12 438/486 |
| 2014/0016057 A1* | 1/2014 | Tsai | G02F 1/136209 349/43 |

(Continued)

FOREIGN PATENT DOCUMENTS

JP 11-84359 3/1999

*Primary Examiner* — Fernando L Toledo
*Assistant Examiner* — Aaron Gray
(74) *Attorney, Agent, or Firm* — Oblon, McClelland, Maier & Neustadt, L.L.P.

(57) ABSTRACT

A display device according to one embodiment, includes a thin-film transistor. The thin-film transistor includes a semiconductor layer including a channel region, first and second high-concentration impurity regions on both sides of the channel region, low-concentration impurity regions on both sides of the channel region, gate electrodes, first and second electrodes, and a light-shielding electrode opposing the channel region and the entire first high-concentration impurity region via an insulating layer, to produce a capacitance between itself and the first high-concentration impurity region.

2 Claims, 6 Drawing Sheets

(56) References Cited

U.S. PATENT DOCUMENTS

2015/0311351 A1* 10/2015 Seko ................ H01L 29/78621
                                                         257/72

* cited by examiner

DISPLAY DEVICE

CROSS-REFERENCE TO RELATED APPLICATIONS

This application is based upon and claims the benefit of priority from Japanese Patent Application No. 2015-036433, filed Feb. 26, 2015, the entire contents of which are incorporated herein by reference.

FIELD

Embodiments described herein relate generally to a display device comprising a semiconductor device.

BACKGROUND

In recent years, display devices comprising thin-film transistors (TFTs) as semiconductor devices have been put into practical use. Examples of such display devices include liquid crystal displays and organic electroluminescent display devices. Generally, a TFT comprises a semiconductor layer of amorphous silicon, polysilicon or the like. More recently, as for the TFTs, a structure comprising an oxide semiconductor layer, a typical example of which is indium oxide gallium zinc (IGZO), has been intensively researched.

For example, with respect to liquid crystal displays, there is a demand for a technology to perform intermittent driving at low frequency to achieve low power consumption in still image display. As a switching element for pixels of liquid crystal displays, a TFT comprising a semiconductor layer of polysilicon is known. In this TFT, the pixel voltage applied to the liquid crystal varies because of the leakage current produced when the video signal is in off state. For this reason, if the pixels are intermittently driven at low frequency, a problem may arise wherein flicker becomes noticeable.

A conventional measure for the above-described problem is a method of reducing variation in pixel voltage by providing a sufficiently large retention capacitance in parallel with a light-shielding electrode and liquid crystal. However, as pixels continue to become smaller, it is becoming difficult to provide a large retention capacitance.

DETAILED DESCRIPTION

Figure 1:
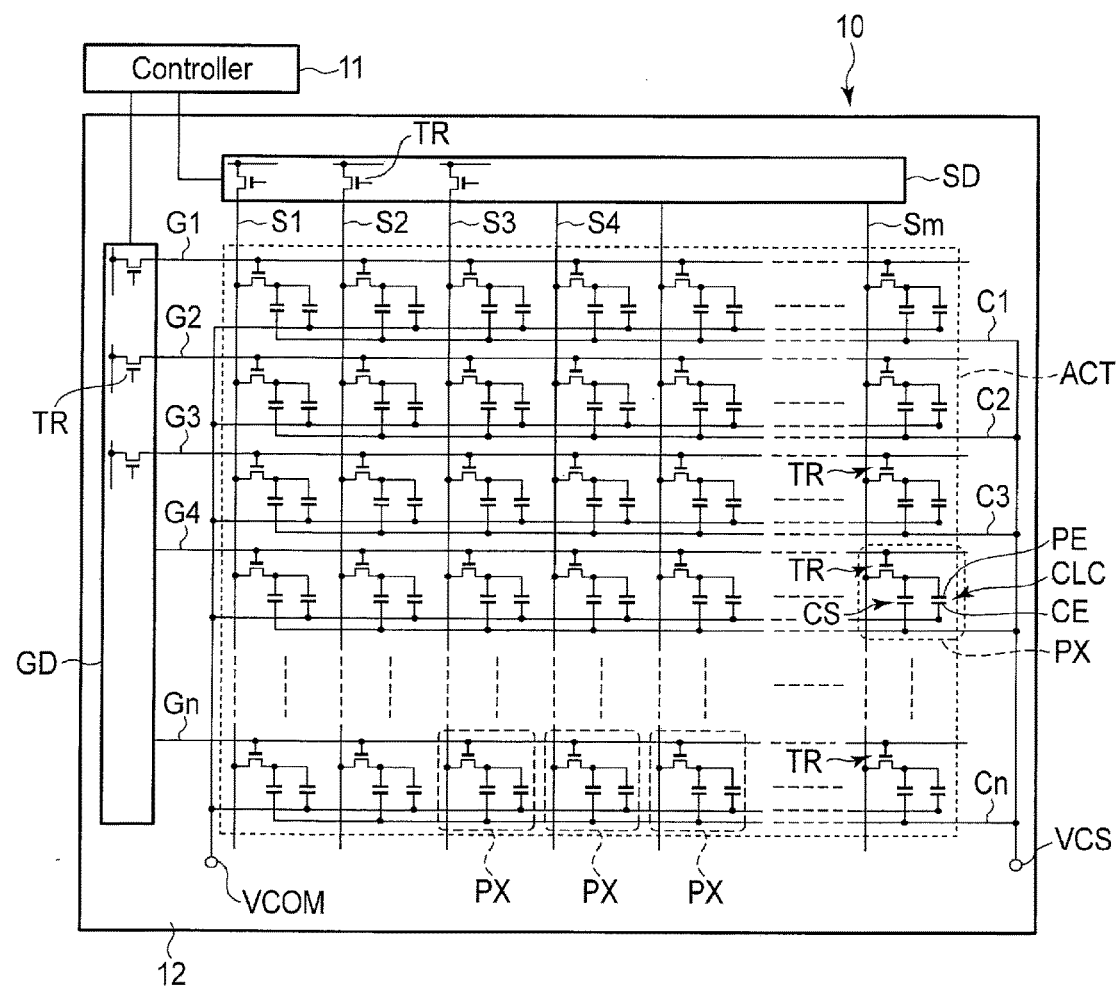
FIG. 1 is a diagram briefly showing an example of the structure of a display device according to a first embodiment.

Various embodiments will be described hereinafter with reference to the accompanying drawings. In general, according to one embodiment, a display device comprises an insulating substrate and a plurality of thin-film transistors provided on the insulating substrate. At least one of the thin-film transistors comprises: a semiconductor layer comprising a channel region, a first high-concentration impurity region and a second high-concentration impurity region which are provided on both sides of the channel region, a low-concentration impurity region located between the channel region and the first high-concentration impurity region, a low-concentration impurity region located between the channel region and the second high-concentration impurity region; a gate electrode opposing the channel region via an insulating layer; a first electrode connected to the first high-concentration impurity region; a second electrode connected to the second high-concentration impurity region; and a light-shielding electrode opposing the channel region of the semiconductor layer and the entire first high-concentration impurity region via an insulating layer to produce a capacitance between the light-shielding electrode and the first high-concentration impurity region.

It should be noted that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustrations are merely examples, and add no restrictions to the interpretation of the invention. Also, in the specification and drawings, the structural elements having functions, which are identical or similar to those of the structural elements described in connection with preceding drawings are denoted by like reference numbers, and an overlapping detailed description is omitted unless otherwise necessary.

First Embodiment

FIG. 1 is a diagram briefly showing an example of the structure of a display device according to a first embodiment. Note that this embodiment will be described in connection with a liquid crystal display 10 as an example of the display device comprising a semiconductor device. The display device 10 can be incorporated in various devices such as smartphones, tablets, mobile phones, notebook personal computers, potable game consoles, electronic dictionaries and television receivers.

As shown in FIG. 1, the liquid crystal display 10 comprises a display unit (active area) ACT configured to display images, and drive circuits GD and SD configured to drive the display unit ACT. The display unit ACT comprises a plurality of display pixels PX arranged in a matrix.

In the display unit ACT, a plurality of gate lines G (G1-Gn), a plurality of capacitance lines C (C1-Cn), a plurality of video signal lines (signal lines) S (S1-Sm) and the like are formed. Each gate line G is drawn outside of the display unit ACT and connected to a gate-line drive circuit GD. Each signal line S is drawn outside of the display unit ACT and connected to a signal-line drive circuit SD. The capacitance lines C are electrically connected to a voltage application portion VCS, to which an auxiliary capacitive voltage is applied.

The gate-line drive circuits GD and the signal-line drive circuit SD each comprise a plurality of thin-film transistors (TFTs) TR functioning as switching elements and are formed on an insulating substrate 12 to be integrated therewith outside of the display unit ACT. The gate-line drive circuits GD and the signal-line drive circuits SD are connected to a controller 11.

Each display pixel PX consists of a liquid crystal capacitor CLC, a TFT TR, a storage capacitor CS in parallel with the liquid crystal capacitor CLC, and the like. The liquid crystal capacitor CLC comprises a pixel electrode PE connected to the TFT TR, a common electrode CE electrically connected to a power supply module VCOM at a common potential, and a liquid crystal layer interposed between the pixel electrode PE and the common electrode CE.

The TFT TR is electrically connected to the gate lines G and the signal lines S. To the gate lines G, control signals to turn the TFT TR on and off are supplied from the gate-line drive circuit GD. Video signals are supplied to the signal lines S from the signal-line drive circuit SD. The TFT TR, when turned on based on the control signal supplied to the gate lines G, writes a pixel potential according to the video signal supplied to the signal line S to the pixel electrode PE. The voltage applied to the liquid crystal layer is controlled by the potential difference between the common electrode CE at the common potential and the pixel electrode PE at a pixel potential.

Figure 2:
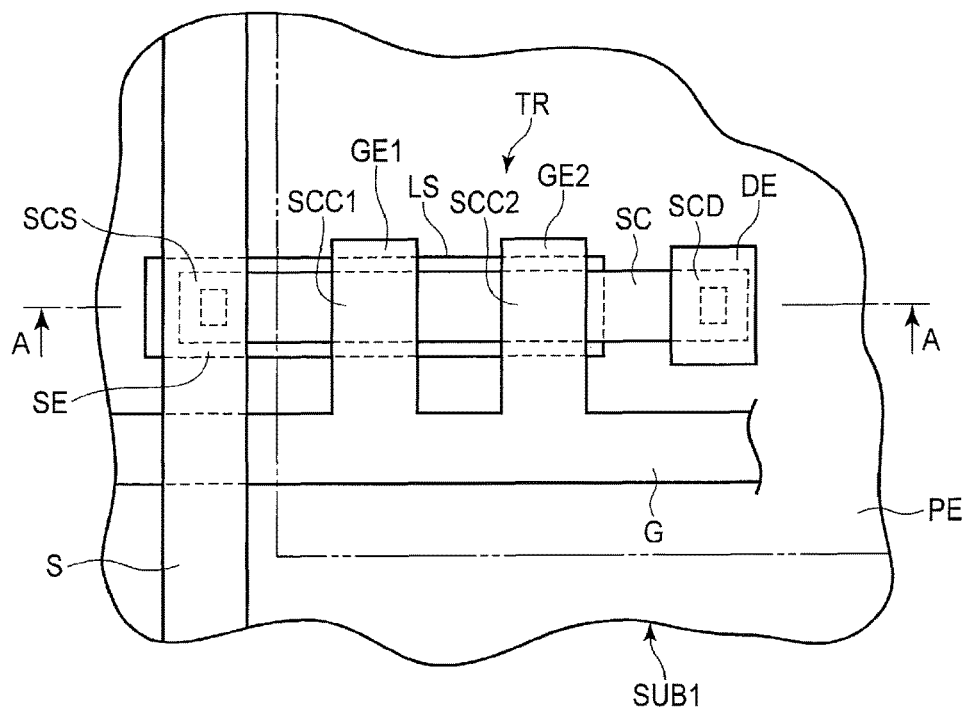
FIG. 2 is a plan view briefly showing an example of the structure of an array substrate applicable to the liquid crystal display shown in FIG. 1.
Figure 3:
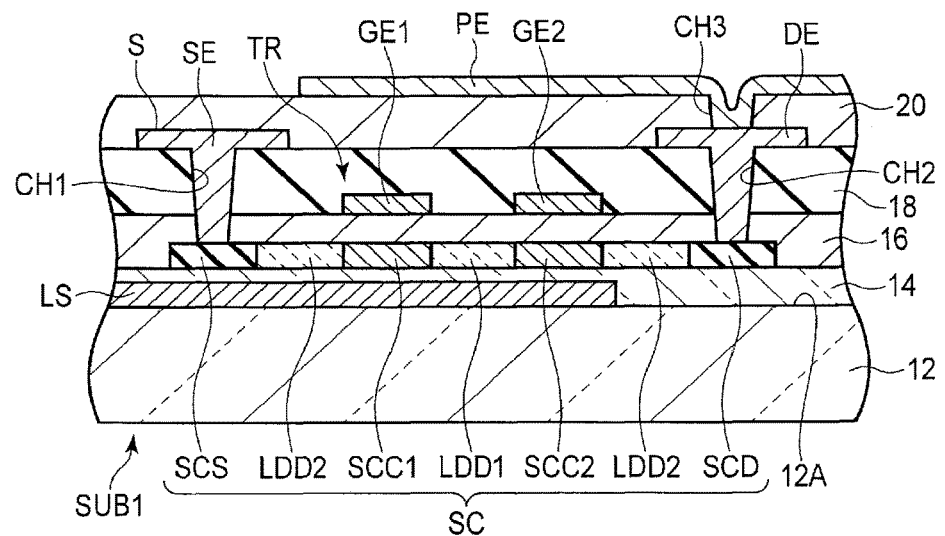
FIG. 3 is a sectional view of the array substrate taken along line A-A of FIG. 2.

FIG. 2 is a plan view showing briefly an example of the structure of an array substrate applicable to the liquid crystal display 10 shown in FIG. 1. FIG. 3 is a sectional view showing the array substrate and a thin-film transistor taken along line A-A of FIG. 2.

An array substrate SUB1 is formed from an insulating substrate 12 having light transmissivity, such as a glass substrate and a resin substrate. The array substrate SUB1 comprises a TFT TR and a storage capacitor, which constitute each display pixel PX, and a plurality of TFTs TR which constitute the gate-line drive circuit GD and the signal-line drive circuit SD on the insulating substrate 12. Here, a TFT TR which functions as a semiconductor device will be considered in the following detailed description.

In the structure example shown in FIGS. 2 and 3, an inner surface 12A of the insulating substrate 12 is covered by a first insulating layer (undercoat layer) 14. The first insulating layer 14 is formed from, for example, silicon oxide (SiOx) or silicon acid nitride (SiONy).

The TFT TR comprises a semiconductor layer SC provided on the first insulating layer 14, gate electrodes GE1 and GE2 provided on the semiconductor layer SC via a second insulating layer 16, a source electrode SE and a drain electrode DE provided on a third insulating layer 18 which covers the gate electrodes GE1 and GE2, to form a top-gate transistor. The TFT TR of this embodiment is formed as a double-gate type, which includes two gate electrodes. Further, a light-shielding electrode LS is provided in the first insulating layer 14. The light-shielding electrode LS is located on the opposite side to the gate electrodes GE1 and GE2 and opposes the semiconductor layer SC via the first insulating layer 14. Note that the term "light-shielding electrode" is used here to cover a concept including a light-shielding layer or a light-shielding film.

On the first insulating layer 14, a semiconductor layer SC of, for example, a low-temperature polysilicon is formed. The semiconductor layer SC is patterned into a slender rectangle (linear shape). The semiconductor layer SC comprises two channel regions (first region) SCC1 and SCC2, a first low-concentration impurity region (n−) LDD1 located between these channel regions and doped with phosphorus as an impurity, and source region (first high-concentration impurity region n+) SCS and a drain region (second high-concentration impurity region n+) SCD, located on both sides of the channel regions SCC1 and SCC2 while sandwiching them, and doped with, for example, phosphorus. The source region SCS and the drain region SCD have a resistance lower than that of the channel regions SCC1 and SCC2. The semiconductor layer SC further comprises second low-concentration impurity regions (n−) LDD2 located between the source region SCS and the channel region SCC1 and between the drain region SCD and the channel region SCC2, respectively. The source region SCS, the second low-concentration impurity region LDD2, the channel-region SCC1, the first low-concentration impurity region LDD1, the channel regions SCC2, the second low-concentration impurity region LDD2 and the drain regions SCD are arranged along the longitudinal direction of the semiconductor layer SC.

The light-shielding electrode LS is provided in the first insulating layer 14 between the insulating substrate 12 and the semiconductor layer SC. The light-shielding electrode LS opposes the semiconductor layer SC via the first insulating layer 14. The light-shielding electrode LS is formed of a conductive light-shielding material, for example, a metal material such as molybdenum, tungsten, aluminum or titanium, or an alloy or the like of any of these metals.

The light-shielding electrode LS is patterned into, for example, a slender rectangle. The light-shielding electrode LS is formed wider than the semiconductor layer SC, and larger in area than the channel regions SCC1 and SCC2 or the source region SCS. The light-shielding electrode LS is provided to face, that is, to overlap the entire region of the channel regions SCC2, the first low-concentration impurity region LDD1, the channel-regions SCC1, the second low-concentration impurity region LDD2 and the source region SCS. The lateral both ends of the light-shielding electrode LS extend over both sides edges of the semiconductor layer SC. Further, an end (one longitudinal end) on a signal line S side of the light-shielding electrode LS extends over the end of the source region SCS of the semiconductor layer SC.

Note that the light-shielding electrode LS is located fully distant away from the drain region SCD without overlapping therewith. Further, the light-shielding electrode LS is covered with the first insulating layer 14, and the potential thereof is floating.

The light-shielding electrode LS is located to overlap the two channel regions SCC1 and SCC2 thereby shielding the channel regions SCC1 and SCC2. Further, the light-shielding electrode LS opposes the source region SCS via the first insulating layer 14 to produce a retention capacitance between itself and the source region SCS. As described later, the source region SCS is electrically connected to a signal line S through the source electrode. With this structure, the potential of the source region SCS and the potential of the light-shielding electrode LS vary according to the signal line potential. Note that the drain region SCD of the semiconductor layer SC is located well away from the light-shielding electrode LS, and therefore even if the potential of the signal line S is varied, the pixel voltage is not affected.

The second insulating layer (gate insulating layer) 16 is formed on the semiconductor layer SC to cover the semiconductor layer SC. The gate electrodes GE1 and GE2, which constitute the TFT TR, are provided on the second insulating layer 16 to oppose the channel regions SCC1 and SCC2 of the semiconductor layer SC, respectively. In other words, the channel region SCC1 and the gate electrode GE1 oppose each other via the second insulating layer 16, whereas the channel region SCC2 and the gate electrode GE2 oppose via the second insulating layer 16.

The gate electrode GE1 and GE2 are formed from a wiring material, that is, for example, a metal material such as molybdenum, tungsten, aluminum or titanium, or an alloy containing any of these metals. The gate electrodes GE1 and GE2 are electrically connected to a gate line G formed in the same layer as, for example, a gate electrode, or formed to be integrated with the gate line G.

The gate electrodes GE1 and GE2 and the second insulating layer 16 are covered by the third insulating layer 18. Examples usable as the material for the third insulating layer 18 are a silicon oxide (SiOx) and a silicon acid nitride (SiONy).

The source electrode SE and the drain electrode DE, which constitute the TFT TR, and the signal lines S are formed on the third insulating layer 18. The source electrode SE is in contact with the source region SCS of the semiconductor layer SC via a contact hole CH1 made through the third insulating layer 18. The source electrode SE is connected to the respective signal line S or is formed to be integrated with the signal line S. The drain electrode DE is in contact with the drain region SCD of the semiconductor layer SC via a contact hole CH2 made through the third insulating layer 18. The source electrode SE and the drain electrodes DE are formed of the same wiring material.

The signal line S, the source electrode SE and the drain electrode DE are covered by the fourth insulating layer 20. Usable examples of the material for the fourth insulating layer 20 are a silicon oxide (SiOx) and a silicon acid nitride (SiONy). The pixel electrode PE is provided on the fourth insulating layer 20. A portion of the pixel electrode PE is electrically continuous to the drain electrode DE via a contact hole CH3 made through the fourth insulating layer 20.

Figure 4:
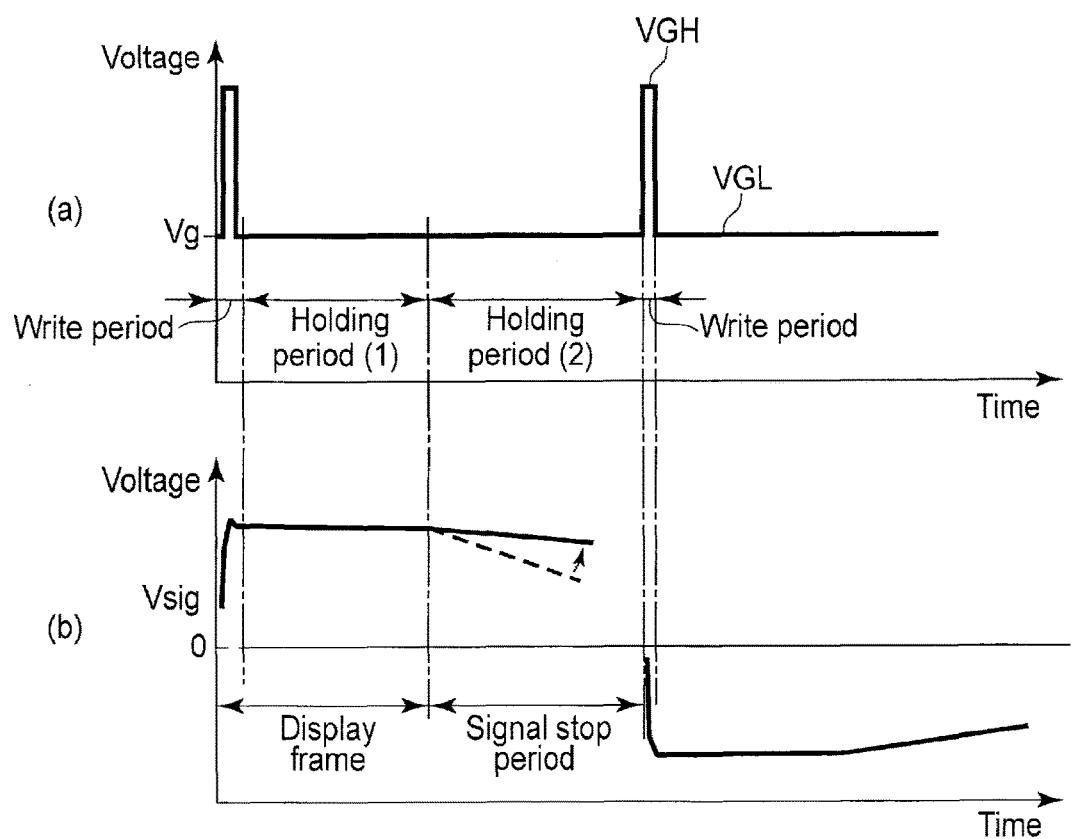
FIG. 4 is a timing chart showing a driving timing for a display pixel.

According to the liquid crystal display 10 comprising the above-described array substrate SUB1, the signal-line drive circuit SD and the gate-line drive circuit GD intermittently drive the display pixels PX at a low frequency of about 60. Hz, and change the voltage of the signal lines S during the holding period to a high voltage, for example, a voltage equivalent to white gradation. FIG. 4 shows a timing chart of driving a display pixel. As shown in FIG. 4(a), the gate-line drive circuit GD makes the voltage of the gate line G high (VGH) for every row in a write period to turn the TFT TR of the display pixel PX on. Then, the gate-line drive circuit GD makes the voltage of the gate line G low (VGL) to turn the TFT TR of the display pixel PX off.

As shown in FIG. 4(b), the signal-line drive circuit SD outputs a predetermined video signal voltage Vsig to the signal lines S for every column to write a signal potential in each display pixel PX in a write period. If the signal voltage Vsig is written, liquid crystal responds to reach its predetermined brightness. A holding period (1) is a period in which the signal voltage is written in display pixels PX belonging to some other row. In the following holding period (2), the signal line drive circuit SD changes the potential of the signal line S and here, set it to high, which is a voltage equivalent to white gradation. Usually, in the holding periods (1) and (2), the voltage being held for the leakage current flowing via the liquid crystal capacitor CLC or the TFT TR decreases gradually. According to this embodiment, however, a voltage is applied to the signal line S from the signal-line drive circuit SD to suppress the fall of the held voltage but change it to a high voltage equivalent to white gradation.

In the holding periods (1) and (2), the drive voltage Vg of the gate line G by the gate-line drive circuit SG is low (VGL), and therefore the TFT TR is in the off state. Thus, the potential of the signal line S is not written in the display pixel PX.

According to the liquid crystal display 10 and the semiconductor device, configured as above, a light-shielding electrode LS opposing the semiconductor layer SC is provided to overlap a high-concentration impurity region (source region) on the signal line side. With this structure, a capacitive coupling is produced between the high-concentration impurity region and the light-shielding electrode LS via an insulating layer. If the potential of the signal line S is varied while the TFT TR is off, the potential of the light-shielding electrode LS is varied accordingly. Therefore, by controlling the signal line potential, for example, by increasing the voltage of the signal line S, electric field is moderated and the leakage current of the TFT TR can be suppressed. Moreover, the light-shielding electrode LS does not oppose the drain region of the semiconductor layer, and therefore even if it the signal line potential is varied, the voltage of the respective pixel electrode is not affected. Thus, if the liquid crystal display 10 is intermittently driven at low frequency, flicker does not occur but good display characteristics are obtained.

Moreover, also in the liquid crystal display provided with a backlight unit on a back of the array substrate SUB1 comprising the TFTs TR, irradiation of light such of the backlight onto the channel regions SCC1 and SCC2 of the semiconductor layer SC can be shielded by the light-shielding electrode LS. Thus, the increase in the current of the TFTs TR when in off state or the degradation of the transistor characteristics, which may be caused by light irradiation, can be suppressed.

As described above, according to this embodiment, it is possible to provide a semiconductor device which can reduce the leakage current thereof to stabilize the drive, and a display device comprising the semiconductor device.

Next, a thin film transistor of a display device according to another embodiment will be described. Note that in the following further embodiment, the same structural members as those of the first embodiment provided above will be designated by the same reference numbers, and detailed descriptions thereof will be omitted. The following descriptions are mainly focusing on the distinctive parts with respect to the first embodiment.

Second Embodiment

Figure 5:
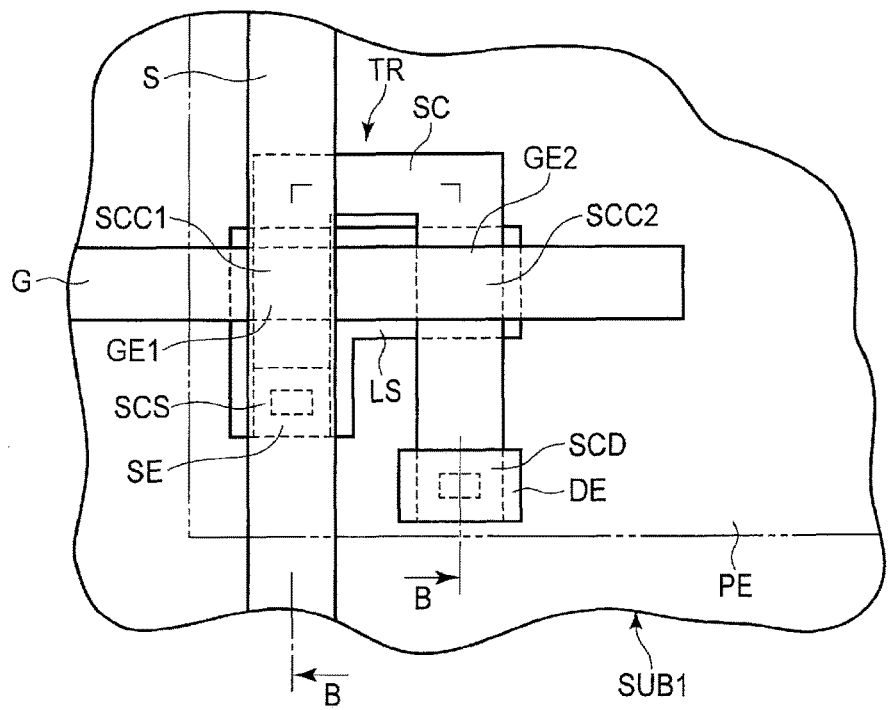
FIG. 5 is a plan view showing an example of the structure of an array substrate of a display device according to a second embodiment.
Figure 6:
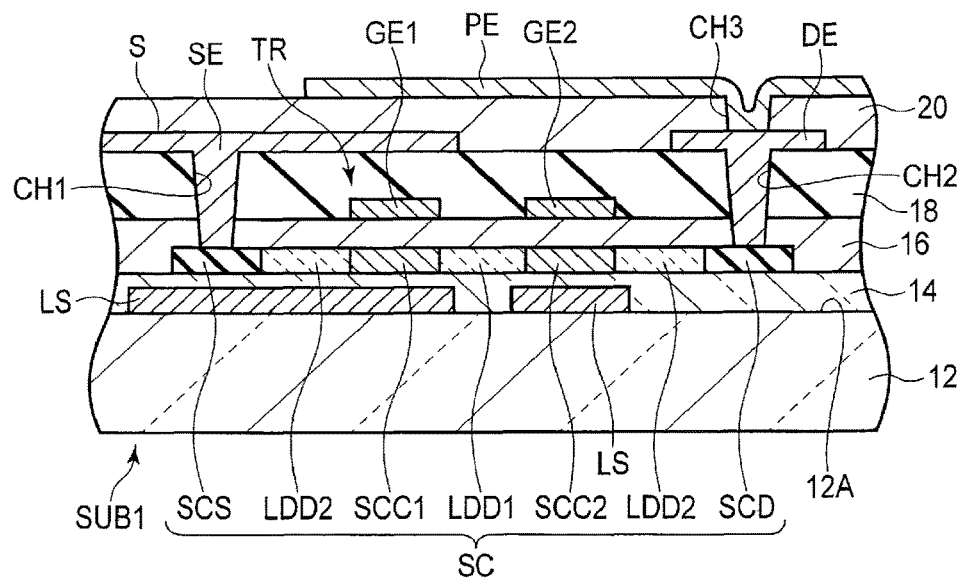
FIG. 6 is a sectional view of the array substrate taken along line B-B of FIG. 5.

FIG. 5 is a plan view showing an example of the structure of an array substrate of a display device according to a second embodiment, and FIG. 6 is a cross-sectional view of the example of the structure of the array substrate taken along line B-B of FIG. 5.

According to the second embodiment, a semiconductor layer SC of a thin-film transistor (TFT) TR is not formed straight but bent into approximately a U-shape. Similarly, a light-shielding electrode LS is not formed straight, but bent into approximately an L-shape.

Gate lines G are formed straight, and each overlaid on the semiconductor layer SC at two locations. The overlaid portions form gate electrodes GE1 and GE2, respectively. The gate electrodes GE1 and GE2 oppose channel regions SCC1 and SCC2 of semiconductor layer SC, respectively, while interposing a gate insulating layer 16 therebetween.

A light-shielding electrode LS is provided in the first insulating layer 14 and between an insulating substrate 12 and the semiconductor layer SC, to oppose the semiconductor layer SC via the first insulating layer 14. The light-shielding electrode LS, patterned in the L-shape is wider than the semiconductor layer SC and larger in area than the channel regions SCC1 and SCC2 or the source region SCS. A portion of the light-shielding electrode LS extends straight along the respective gate line G, to oppose the channel region SCC2, a first low-concentration impurity region LDD1, and the channel-region SCC1. The other portion of the light-shielding electrode LS extends along the respective signal line S to oppose a second low-concentration impurity region LDD2 on the source region SCS side and the entire source region SCS, or to overlap therewith. Lateral both ends of the light-shielding electrode LS extend over both sides edge of the semiconductor layer SC, respectively. Further, a signal-line S-side end (a longitudinal end) of the light shielding electrode LS extends over the end of the source region SCS of the semiconductor layer SC. Note that the light-shielding electrode LS is sufficiently far from the drain region SCD without overlapping therewith.

The light-shielding electrode LS is located to overlap the two channel regions SCC1 and SCC2, thus shielding the channel regions SCC1 and SCC2 from light. Further, the light-shielding electrode LS is located to oppose the source region SCS via the first insulating layer 14, thereby producing a holding capacitance between itself and the source region SCS.

In the second embodiment, the other structures of the array substrate and the display device are the same as those of the first embodiment. According to the second embodiment, it is possible to provide a semiconductor device which can reduce the leakage current thereof to stabilize the drive, and a display device comprising the semiconductor device. Further, with the bent shape of the semiconductor layer SC, the occupancy area of the TFT TR decreases, thereby making it effective to further miniaturize the display device.

Third Embodiment

Figure 7:
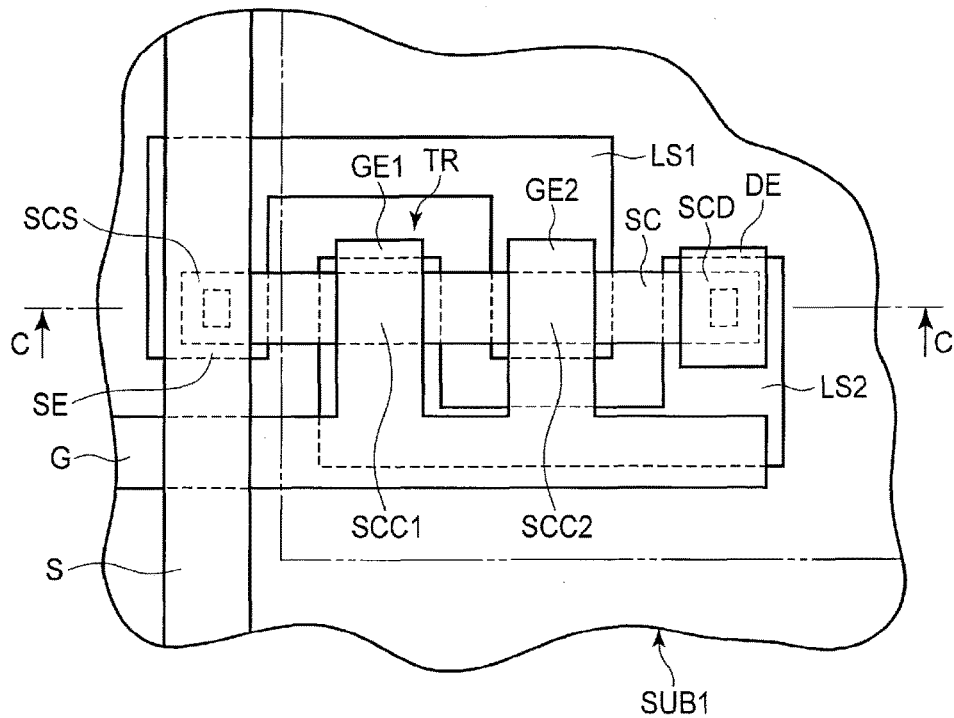
FIG. 7 is a plan view showing an example of the structure of an array substrate of a display device according to a third embodiment.
Figure 8:
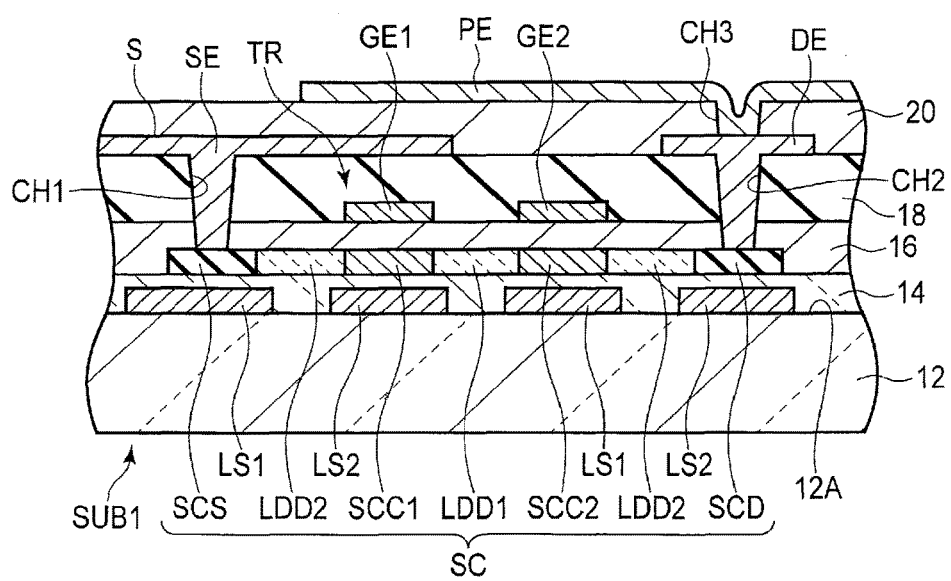
FIG. 8 is a sectional view of the array substrate taken along line C-C of FIG. 7.

FIG. 7 is a plan view showing an example of the structure of an array substrate of a display device according to a third embodiment, and FIG. 8 is a cross-sectional view of the example of the structure of the array substrate taken along line C-C of FIG. 7. According to the third embodiment, a semiconductor layer SC is formed into a linear shape and a light-shielding electrode LS of a thin-film transistor (TFT) TR is divided into a plurality of electrodes; for example, it may be divided into two to form a first light-shielding electrode LS1 and a second light-shielding electrode LS2. The first light-shielding electrode LS1 is bent into approximately a U-shape, and arranged to oppose one channel region SCC2 and one high-concentration impurity region (source region) SCS on the signal line S side. In this embodiment, the first light-shielding electrode LS1 opposes the channel region SCC2 on the drain region SCD side, of the two channel regions. The first light-shielding electrode LS1 is larger in area than the channel region SCC2 or the source region SCS. The first light-shielding electrode LS1 is provided to overlap the source region SCS via the insulating layer 14 to produce a coupling capacitance.

The second light-shielding electrode LS2 is bent into approximately a U-shape, and is arranged to oppose the other channel region SCC1 and the high-concentration impurity region (drain region) SCD on a pixel electrode side. In this embodiment, the second light-shielding electrode LS2 opposes the channel-region SCC1 on the source region SCS side, of the two channel regions. The second light-shielding electrode LS2 is larger in area than the channel region SCC1 or the drain region SCD. The second light-shielding electrode LS2 is provided to overlap the drain region SCD via the insulating layer 14 to produce a coupling capacitance.

In the third embodiment, the other structures of the array substrate and the display device are the same as those of the first embodiment described above. According to the third embodiment, if the potential of the signal line S is varied while the TFT TR is in the OFF state, the potential of the first light-shielding electrode LS1 is varied accordingly. Therefore, by controlling the signal line potential, for example, by increasing the voltage of the signal line S, electric field is moderated and the leakage current of the TFT TR can be suppressed. Moreover, the first light-shielding electrode LS1 does not oppose the drain region SCD of the semiconductor layer, and therefore even if it the signal line potential is varied, the voltage of the respective pixel electrode is not affected.

When the potential of the signal line S is higher than the pixel potential, the potential of the semiconductor layer SC is lowered by the second light-shielding electrode LS2, and thus the leakage current decreases. When the potential of the signal line S is lower than the pixel potential, the potential of the semiconductor layer SC is lowered by the first light-shielding electrode LS1, and thus the leakage current decreases.

As described above, according to the third embodiment, it is also possible to provide a semiconductor device which can reduce the leakage current thereof to reduce the flicker and stabilize the drive, and a display device comprising the semiconductor device.

Fourth Embodiment

Figure 9:
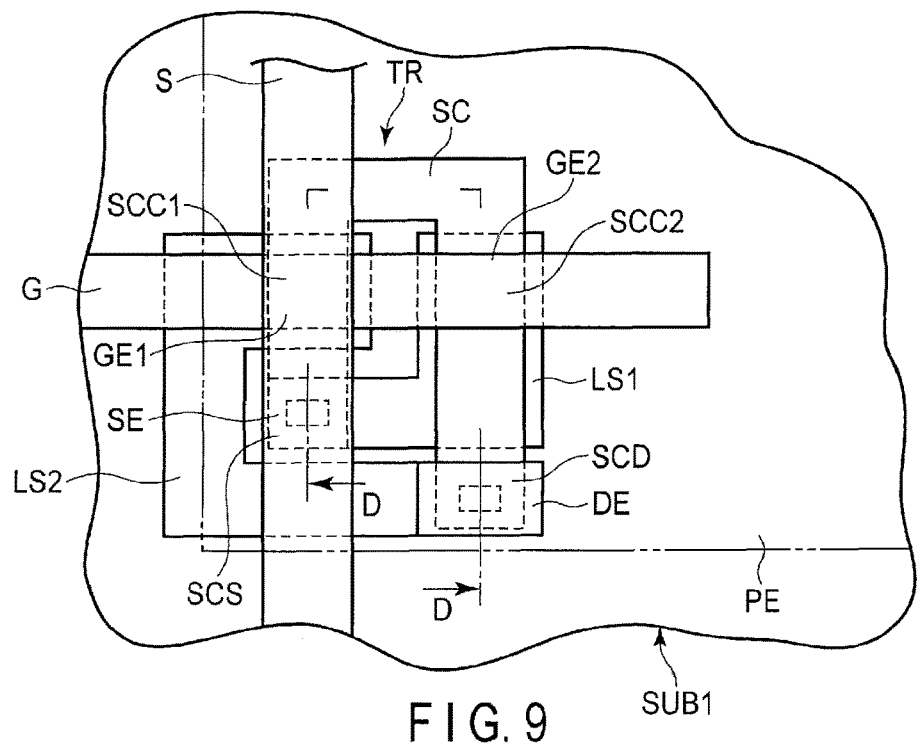
FIG. 9 is a plan view showing an example of the structure of an array substrate of a display device according to a fourth embodiment.
Figure 10:
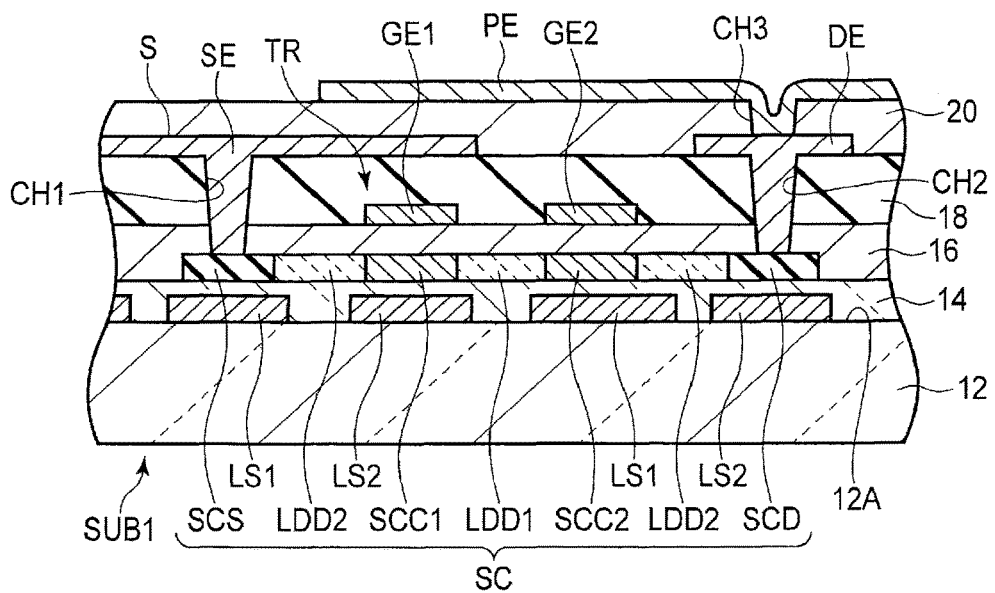
FIG. 10 is a sectional view of the array substrate taken along line D-D of FIG. 9.

FIG. 9 is a plan view showing an example of the structure of an array substrate of a display device according to a fourth embodiment, and FIG. 10 is a cross-sectional view of the example of the structure of the array substrate taken along line D-D of FIG. 9.

According to the fourth embodiment, a semiconductor layer SC of a thin-film transistor (TFT) TR is not formed into a linear shape, but is bent into approximately a U-shape. A light-shielding electrode LS of the TFT TR is divided into a plurality of electrodes; for example, it may be divided into two to form a first light-shielding electrode LS1 and a second light-shielding electrode LS2.

Gate lines G are formed straight, and each overlaid on the semiconductor layer SC at two locations. The overlaid portions form gate electrodes GE1 and GE2, respectively. The gate electrodes GE1 and GE2 oppose channel regions SCC1 and SCC2 of the semiconductor layer SC, respectively, while interposing a gate insulating layer 16 therebetween.

The first light-shielding electrode LS1 is bent into, approximately, an L-shape, and arranged to oppose one channel region SCC2, one low-concentration impurity region LDD2 and one high-concentration impurity region (source region) SCS on the signal line S side. The first light-shielding electrode LS1 is larger in area than the channel region SCC2 or the source region SCS. The first light-shielding electrode LS1 is provided to overlap the source region SCS via the insulating layer 14 to produce a coupling capacitance.

The second light-shielding electrode LS2 is bent into, approximately, a U-shape, and is arranged to oppose the other channel region SCC1 and the high-concentration impurity region (drain region) SCD on a pixel electrode side. The second light-shielding electrode LS2 is larger in area than the channel region SCC1 or the drain region SCD. The second light-shielding electrode LS2 is provided to overlap the drain region SCD via the insulating layer 14 to produce a coupling capacitance.

In the fourth embodiment, the other structures of the array substrate and the display device are the same as those of the first embodiment described above. According to the third embodiment, if the potential of the signal line S is varied while the TFT TR is off, the potential of the first light-shielding electrode LS1 is varied accordingly. Therefore, by controlling the signal line potential, for example, by increasing the voltage of the signal line S, electric field is moderated and the leakage current of the TFT TR can be suppressed. Moreover, the first light-shielding electrode LS1 does not oppose the drain region SCD of the semiconductor layer, and therefore even if it the signal line potential is varied, the voltage of the respective pixel electrode is not affected.

When the potential of the signal line S is higher than the pixel potential, the potential of the semiconductor layer SC is lowered by the second light-shielding electrode LS2, and thus the leakage current decreases. When the potential of the signal line S is lower than the pixel potential, the potential of the semiconductor layer SC is lowered by the first light-shielding electrode LS1, and thus the leakage current decreases. As described above, according to the third embodiment, it is also possible to provide a semiconductor device which can reduce the leakage current thereof to reduce the flicker and stabilize the drive, and a display device comprising the semiconductor device. Further, with the bent shapes of the semiconductor layer SC and the light-shielding electrodes LS, the occupancy area of the TFT TR decreases, thereby making it effective to further miniaturize the display device.

The above-provided embodiments are described in connection with a liquid crystal display as an example of the display device comprising thin-film transistors, but can be applied to any types of flat-panel display devices, examples of which are an organic EL display device, other types of auto-luminescent display devices, and an electronic-paper display device having an electrophoretic element or the like. Needless to say, structures and manufacturing processes similar to those described in the above embodiments can be applied to display devices of small-, medium or large-size without any particular limitations. Further, the embodiments provided above are described in connection with a double-gate TFT, but they are not limited to this. For example, a single-gate semiconductor device can be used as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Note that all the structures which can be carried out by any modification and variation conceived within the scope and spirit of the invention by a person having ordinary skill in the art based on each structural elements described in the embodiments are naturally encompassed in the scope of invention of the present application. Further, regarding the present embodiments, any advantage and effect which would be obvious from the description of the specification or arbitrarily conceived by a skilled person are naturally considered achievable by the present invention.

What is claimed is:

1. A display device comprising:
   an insulating substrate, a plurality of thin-film transistors provided on the insulating substrate, and a drive circuit configured to drive the thin-film transistors,
   at least one of the thin-film transistors comprising:
   a semiconductor layer comprising channel regions including a first channel region and a second channel region, a first high-concentration impurity region and a second high-concentration impurity region which are provided on both sides of the channel regions, a first low-concentration impurity region located between the first channel region and the first high-concentration impurity region, a second low-concentration impurity region located between the second channel region and the second high-concentration impurity region, and a third low-concentration impurity region located between the first channel region and the second channel region;
   a gate electrode opposing the channel regions via an insulating layer;
   a first electrode connected to the first high-concentration impurity region;
   a second electrode connected to the second high-concentration impurity region; and
   a light-shielding electrode opposing the channel regions of the semiconductor layer and the entire first high-concentration impurity region via an insulating layer to produce a capacitance between the light-shielding electrode and the first high-concentration impurity region;
   wherein the semiconductor layer is bent into, approximately, a U-shape; and the light-shielding electrode is bent into, approximately, an L-shape, a portion of which extends along a gate line and the other portion of which extends along and overlaps a signal line that connects pixel electrodes of a plurality of pixels.

2. The display device of claim 1, wherein the semiconductor layer is formed of polysilicon.

* * * * *